US00RE35069E

United States Patent [19]

Hallenbeck et al.

[11] E Patent Number: Re. 35,069

[45] Reissued Date of Patent: Oct. 24, 1995

[54] OPTOELECTRONIC DEVICE COMPONENT PACKAGE

[75] Inventors: Gary A. Hallenbeck, Fairport; Wilbert F. Janson, Jr., Shortsville; William B. Jones, Rochester, all of N.Y.

[73] Assignee: Eastman Kodak Company, Rochester, N.Y.

[21] Appl. No.: 260,574

[22] Filed: Jun. 16, 1994

Related U.S. Patent Documents

Reissue of:

[64] Patent No.: 5,149,958
Issued: Sep. 22, 1992
Appl. No.: 626,663
Filed: Dec. 12, 1990

[51] Int. Cl.[6] ..... H01J 3/14; H01L 27/14

[52] U.S. Cl. ..... 250/216; 250/239; 257/432; 257/678

[58] Field of Search ..... 250/239, 216, 250/214.1, 214 R, 208.1; 257/432, 433, 434, 459, 431, 678

[56] References Cited

U.S. PATENT DOCUMENTS

| | | | |
|---|---|---|---|
| 3,244,939 | 4/1966 | Sandbank | 317/101 |
| 3,622,419 | 11/1971 | London | 156/242 |
| 3,820,237 | 6/1974 | Effer | 29/588 |
| 3,938,177 | 2/1976 | Hansen et al. | 357/72 |
| 3,964,157 | 6/1976 | Kuhn et al. | 29/591 |
| 3,999,280 | 12/1976 | Hansen et al. | 29/569 |
| 4,032,963 | 6/1977 | Thome | 357/72 |
| 4,190,855 | 2/1980 | Inoue | 357/80 |
| 4,316,208 | 2/1982 | Kobayashi et al. | 357/55 |
| 4,410,469 | 10/1983 | Katagiri et al. | 264/1.5 |

(List continued on next page.)

FOREIGN PATENT DOCUMENTS

| | | | |
|---|---|---|---|
| 56-103481 | 8/1981 | Japan | H01L 31/18 |
| 56-103484 | 8/1981 | Japan | H01L 31/18 |
| 59-110178 | 6/1984 | Japan . | |
| 59-198770 | 11/1984 | Japan | H01L 31/02 |
| 60-7767 | 1/1985 | Japan | H01L 27/14 |
| 60-153184 | 8/1985 | Japan | H01L 31/02 |
| 62-21282 | 1/1987 | Japan | H01L 31/04 |
| WO89/00337 | 1/1989 | WIPO | H01L 21/56 |

OTHER PUBLICATIONS

JP2026081–Komatsu Yukiaki, Photo–Semiconductor Integrated Circuit Sealing Structure, Mar. 30, 1990, Abstract vol. 014170.

JP60153184–Kuroda Masataka, Light Receiving Element, Dec. 17, 1985, Abstract vol. 009321.

"Considerations for Choosing Chip–On–Board Encapsulants", Art Burkhart & Mark Bonneau, Electronics, Sep. 1985, pp. 67–69.

"Chip–On–Board Alters the Landscape of PC Boards", Electronic Packaging & Production, Jul. 1985, pp. 62–67.

"Tab Rebounds as I/Os Increase", Electronic Packaging & Production, Aug. 1986, pp. 42–45.

*Primary Examiner*—Edward P. Westin
*Assistant Examiner*—John R. Lee
*Attorney, Agent, or Firm*—David A. Howley

[57] ABSTRACT

An optoelectronic device component package comprises an optical element having a plano surface with a pattern of electrical conductors thereon, a photoelectric die having an optically active portion and die bond pads, and a printed circuit board having a pattern of electrical conductors thereon and further having an aperture for receiving the die. The die is attached to the plano surface of the optical element such that the die bond pads are electrically connected to corresponding electrical conductors of the optical elements. The circuit board is attached to the plano surface of the optical element and the electrical conductors of the circuit board are electrically connected to corresponding conductors of the optical element. A protective means affixed to the die, the plano surface of the optical element, and a portion of the circuit board protects the device package. The die can be (1) an emitter or detector die for camera autofocus applications; or (2) a photometer die for exposure control applications.

18 Claims, 4 Drawing Sheets

U.S. PATENT DOCUMENTS

| | | | |
|---|---|---|---|
| 4,610,746 | 9/1986 | Broer et al. | 156/275.5 |
| 4,636,647 | 1/1987 | Nishizawa | 250/551 |
| 4,662,735 | 5/1987 | Karasaki et al. | 354/406 |
| 4,808,812 | 2/1989 | Tanaka et al. | 250/216 |
| 4,843,036 | 6/1989 | Schmidt et al. | 437/224 |
| 4,850,105 | 7/1989 | Nakajima et al. | 29/841 |
| 4,967,260 | 10/1990 | Butt | 357/70 |
| 4,967,261 | 10/1990 | Niki et al. | 357/70 |
| 4,987,260 | 1/1991 | Yasuhara et al. | 564/402 |
| 5,065,227 | 11/1991 | Frankeny et al. | 357/74 |
| 5,066,614 | 11/1991 | Dunaway et al. | 437/209 |
| 5,075,253 | 12/1991 | Sliwa, Jr. | 437/209 |

OPTOELECTRONIC DEVICE COMPONENT PACKAGE

Matter enclosed in heavy brackets [ ] appears in the original patent but forms no part of this reissue specification; matter printed in italics indicates the additions made by reissue.

BACKGROUND OF THE INVENTION

1. Field of the Invention

The invention relates generally to optoelectronic devices and, more particularly, to optoelectronic device component packages and methods of making the same.

2. Description of the Related Art

Optoelectronic devices typically comprise an optical system located in front of a photoelectric device. The optical system can be a lens. The photo-active device can be a light-emitting device or a light-detecting device. The photoelectric device generally comprises a photoelectric die having a light-sensitive or light-emitting region thereon. The photoelectric die includes die bond pads for electrically connecting thereto. Bond wires are used to connect the die bond pads to a lead frame. The photoelectric die, bond wires, and lead frame are encased in a plastic or ceramic material. The optoelectronic device package typically comprises a housing for supporting and locating the lens in front of the photoelectric die.

A disadvantage of the prior art optoelectronic devices is expense, the requirement of bond wires, and the difficulty of accurately locating the optical system in front of the photoelectric device.

For instance, Japanese Laid-Open patent publication No. 62-21282 shows a photoconductive detector. The photoconductive detector includes a lens bonded to a semiconductor layer having opposing electrodes formed in contact with the layer. The lens focuses upon a portion of the available light sensitive area of the detector. One disadvantage of this detector is that it requires traditional bonding techniques, that is, it requires bond wires. In addition, the photoconductive detector must be packaged for use. This adds additional manufacturing costs.

In another Japanese Laid-Open patent publication, No. 60-153184, a light receiving element is shown. The light receiving element includes a photoelement chip fixed to a lower surface of an insulating glass. Electrodes are formed onto the lower surface of the glass. A drawback to the light receiving element is that it requires traditional bonding techniques. That is, a bond wire is required to connect the photoelement chip to an electrode. Thus, in its manufacture, a bond wire must be located to an electrode for each device which adds cost to the manufacture of the device. Furthermore, external lead wires are used for electrically connecting the light receiving element to an external circuit which also increases the cost of using such a device.

In yet another Japanese Laid-Open patent publication, No. 59-198770, a photo receiving electronic device is shown. In the device, a photo receiving element is mounted by a flip chip technique onto a transparent substrate. A drawback of the photo receiving electronic device is that it is not packaged in a ready-for-use form therefore increasing the cost of its use. Furthermore, the transparent substrate of the device provides no significant lens effect, thus, in situations requiring a lens effect an external lens is required.

U.S. Pat. No. 4,843,036 to Schmidt el al shows a method of encapsulating an electronic device on a substrate. The electronic device is attached to the substrate and bond wires are used to connect bond pads of the electronic device to electrical conductors formed on the substrate. An optically clear encapsulant is dispensed over the electronic device and the bond wires, encapsulating the device. Upon curing the encapsulant, a lens-like element is produced. The encapsulated device shown in Schmidt et al suffers from the disadvantage that bond wires are required. Use of bond wires increases the succeptability of the device for failure during its manufacture and also adds cost. Furthermore, the lens-like element produced may not be of sufficient quality for a particular application.

It would thus be desireable to provide an optoelectronic device component package, and methods of making the same, wherein the device package is efficient and reliable. It would be further desireable if the device package could be cost effective in its manufacture and its use.

OBJECTS OF THE INVENTION

The principal object of the present invention is to provide an efficient and reliable optoelectronic device package.

Another object of the present invention is to provide a cost effective method of manufacturing an optoelectronic device package, without the use of traditional bonding techniques.

Another object of the present invention is to provide a cost effective optoelectronic device package.

Still another object of the present invention is to provide an optoelectronic device component that is in ready-for-use condition, without the need for traditional bonding techniques.

SUMMARY OF THE INVENTION

In accordance with a preferred embodiment of the present invention, an optoelectronic device package comprises an optical element having a plano surface with a pattern of electrical conductors thereon, a photoelectric die having an optically active portion and die bond pads, and a printed circuit board having a pattern of electrical conductors thereon and further having an aperture for receiving the die. The die is attached to the plano surface of the optical element such that the die bond pads are electrically connected to corresponding electrical conductors of the optical element. The circuit board is attached to the plano surface of the optical element and the electrical conductors of the circuit board are electrically connected to corresponding conductors of the optical element.

In an alternate embodiment according to the invention, a protective means affixed to the die, the plano surface of the optical element, and a portion of the circuit board protects the device package. The die can be (1) an emitter or detector die for camera autofocus applications; or (2) a photometer die for exposure control applications.

BRIEF DESCRIPTION OF THE DRAWINGS

While the specification concludes with claims defining the features of the invention that are regarded as novel, it is believed that the invention, together with further objects thereof, will be better understood from a consideration of the following description in conjunction with the drawing figures, in which like reference numerals are carried forward, and in which:

DESCRIPTION OF THE PREFERRED EMBODIMENT

Figure 1:
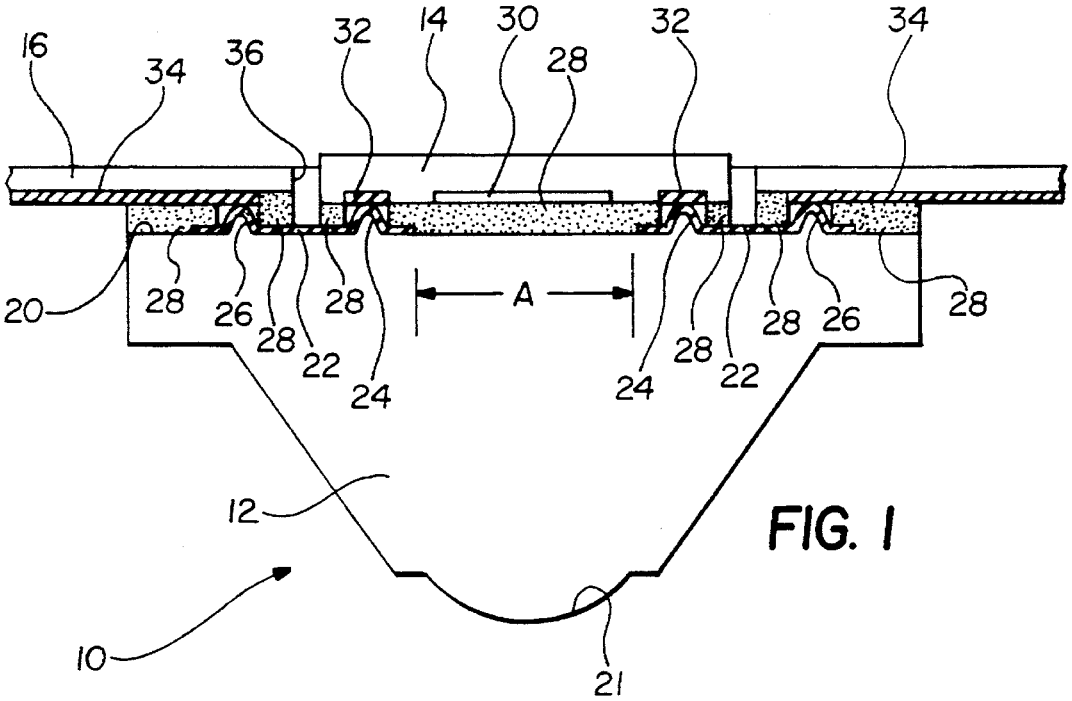
FIG. 1 is a cross-sectional view of an optoelectronic device package in accordance with a preferred embodiment of the invention.

Referring now to FIG. 1, a cross-sectional view of an optoelectronic device package 10 according to the present invention is shown. In this embodiment, the optoelectronic device package 10 comprises an optical element 12, a photoelectric die 14, and a printed circuit board 16. An optoelectronic device component according to the invention comprises optical element 12 having die 14 attached thereto. Optical element 12 is representative of a prime imaging system. Light entering a front surface 21 of element 12 converges onto plano surface 20 to form an image. For example, a desired field of view (or field coverage) may correspond to the lateral size of an area designated by A. In a like manner, light emanating from area A is collimated as it exits front surface 21.

Figure 2:
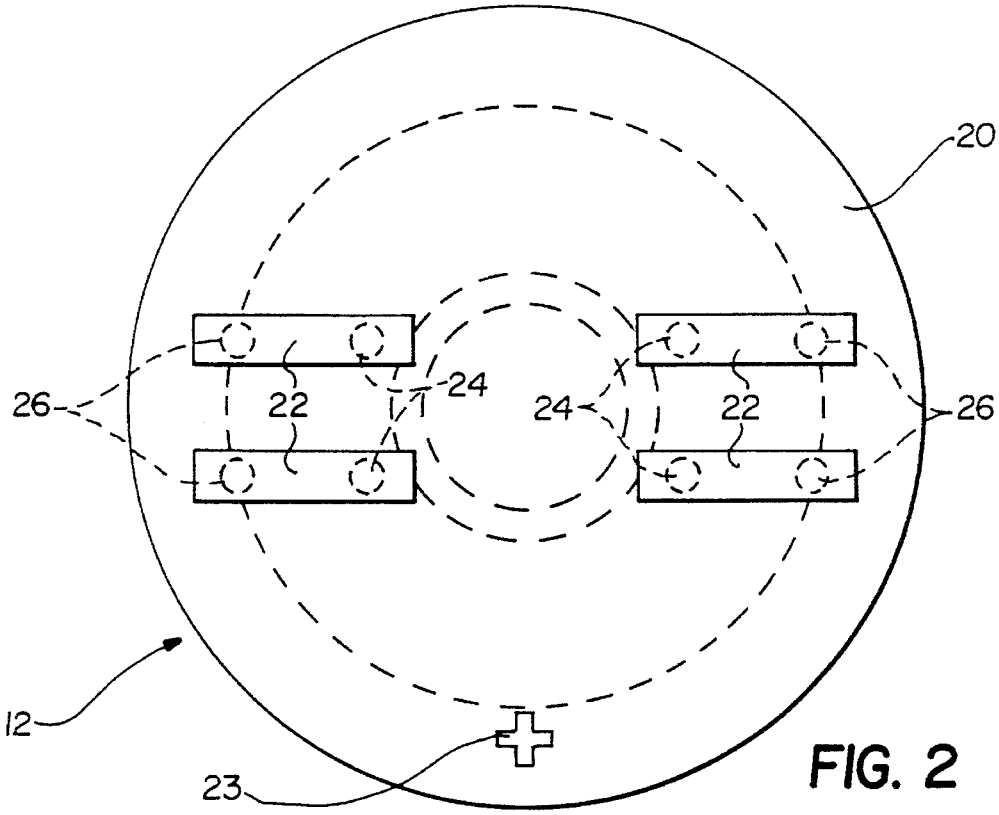
FIG. 2 is a top perspective view of an optical element used in the optoelectronic device package of the present invention.

Referring now to FIG. 1 and FIG. 2, optical element 12 includes refractive surface 21 and plano surface 20. Refractive surface 21 may be aspherical. Optical element 12 may be manufactured by injection molding techniques well known in the art. The focal length of optical element 12 is designed to provide a desired image size, designated by A, such that appropriate coverage of optically active area 30 of die 14 is obtained. In a preferred embodiment, plano surface 20 includes raised bumps 24 and 26. Raised bumps 24 and 26 are formed in plano surface 20 during the injection molding process of making element 12.

Electrical conductors 22 can be formed onto plano surface 20 via vacuum deposition techniques known in the art. Plano surface 20 is appropriately masked and conductive material is deposited thereon. Electrical conductors 22 are formed such that each conductor 22 overlays a first and a second bump, 24 and 26, respectively. An advantage of conductors 22 overlaying bumps 24 and 26 is the elimination of separate conductive bumps at electrical contact points. Such conductive bumps are formed via a process known as conductive bumping, to be explained subsequently. Simultaneously with the forming of conductors 22 is the forming of fiducial mark 23, using the conductive material. Fiducial mark 23 provides a positioning reference for positioning die 14 and circuit board 16 onto element 12.

Figure 3:
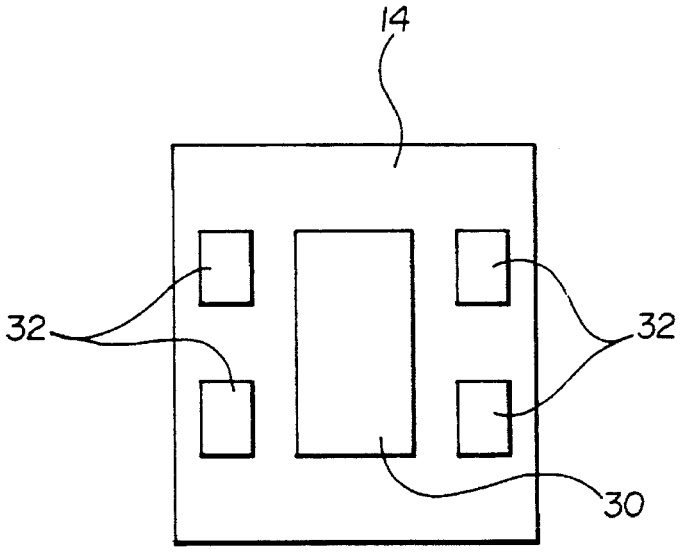
FIG. 3 depicts a front surface view of a photoelectric die used in the optoelectronic device package of the present invention.

Photoelectric dies are well known in the art. Die 14 is representative of a photo detector die or a light emitting die. Making reference now to FIG. 1 and FIG. 3, photoelectric die 14 comprises an optically active portion 30 and die bond pads 32. The optically active portion 30 and the die bond pads 32 are located on a same side of die 14. Optically active portion 30 can be a light receiving portion for receiving light or it can be a light emitting portion for transmitting light. Furthermore, optically active portion 30 can comprise numerous optically active portions.

Die 14 is attached to plano surface 20 of element 12 via an optically transparent non-conductive adhesive 28. Die bond pads 32 electrically connect die 14 to conductors 22 at first bumps 24, wherein, conductors 22 at bumps 24 represent electrical contact points. Adhesive 28 is non-conductive and comprises a curable adhesive having optical grade, high transmission properties. Adhesive 28 also has the properties of being a low viscosity fast curing adhesive. A variety of curing methods are available depending upon the adhesive used, for example, such methods may include but are not limited to thermal, radiation, or chemical catalyst curing. Adhesive 28 may be radiatively curable, for example, commercially available adhesive product UV-311, from. Emerson & Cumming. Adhesive 28 may be selectively screened onto plano surface 20 of element 12, whereby points of electrical connection or electrical contact points on the plano surface 20 are left uncovered by the adhesive.

Turning again to FIG. 1, printed circuit board 16 comprises a circuit board having a circuit pattern (not shown) and electrical conductors 34 thereon. Circuit board 16 can be either a rigid circuit board or a flexible circuit board, wherein circuit board 16 is manufactured by techniques known in the art. Circuit board 16 further includes an aperture 36 for receiving die 14. Circuit board 16 is attached 16 the plano surface 20 of optical element 12 via adhesive 28, wherein die 14 is received within aperture 36. Electrical conductors 34 electrically connect board 16 to conductors 22 second bumps 26, wherein, conductors 22 at bumps 26 represent electrical contact points, also.

Figure 4:
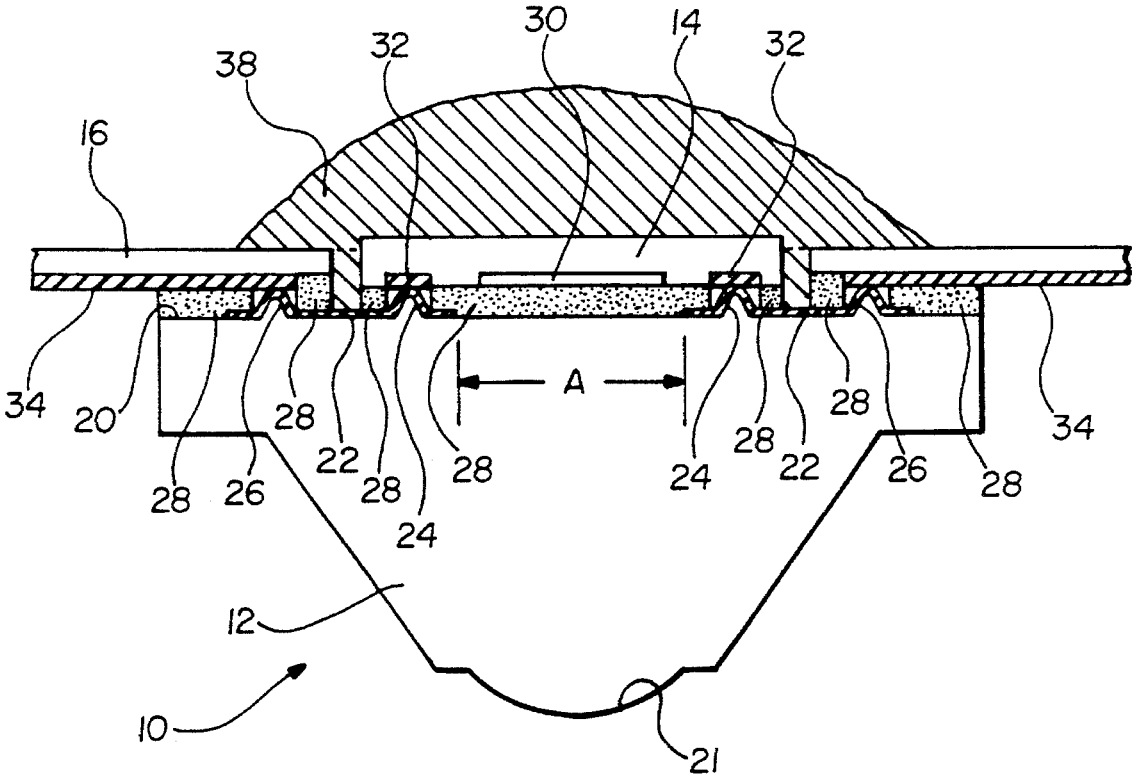
FIG. 4 is a cross-sectional view of an optoelectronic device package in accordance with an alternate embodiment of the invention.
Figure 5:
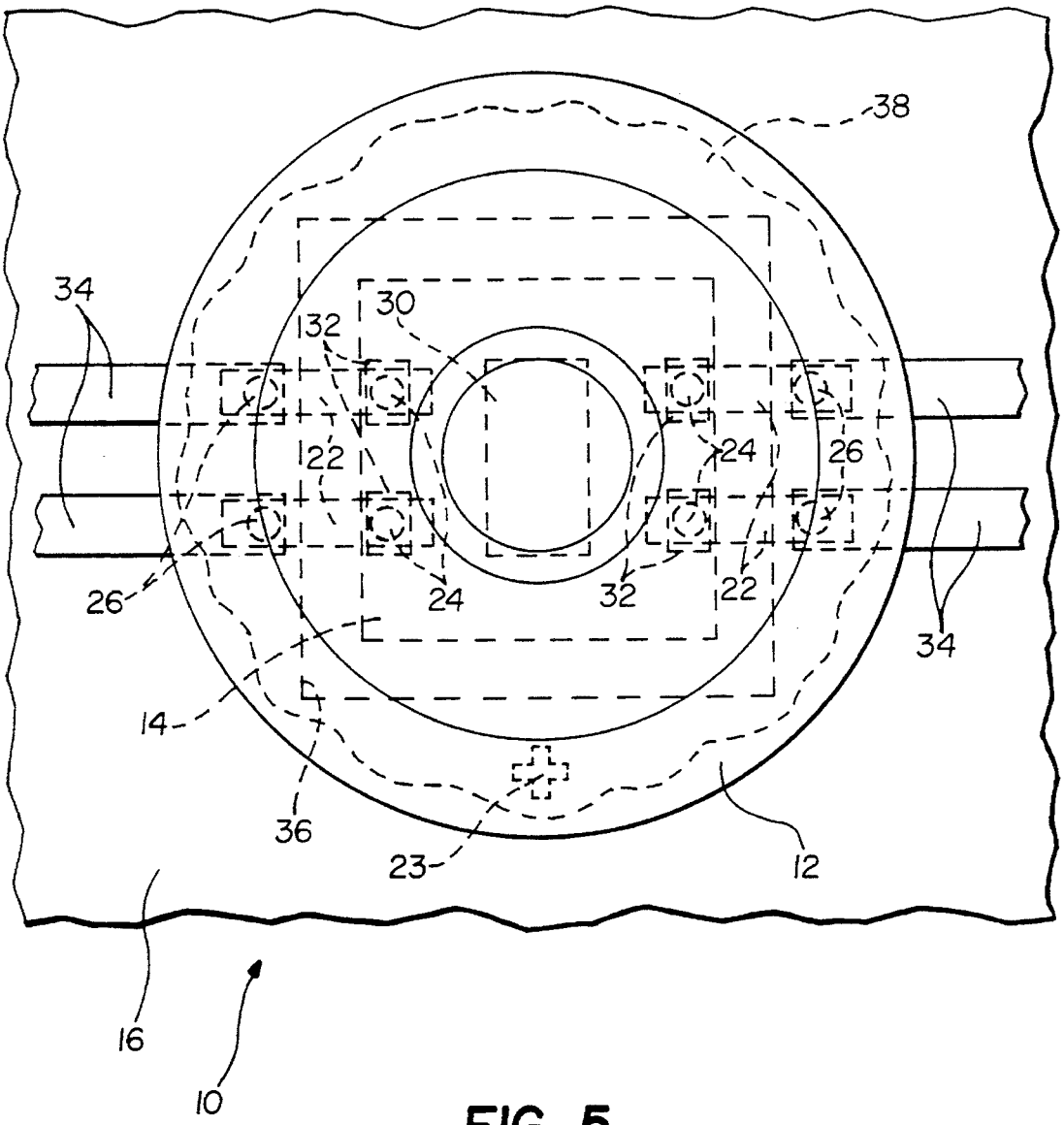
FIG. 5 is a top perspective view of the optoelectronic device package in accordance with the present invention.

Referring now to FIG. 4, optoelectronic device package 10 includes a protective means 38. Protective means 38 protects a back surface of die 14, a portion of plano surface 20, and a portion of circuit board 16. Protective means 38 comprises a protective material attached to die 14, plano surface 20, and board 16. Protective means 38 is preferrably opaque but may also be transparent. The protective material is non-conductive and comprises a low viscosity curable material. A variety of curing methods are available depending upon the adhesive used, for example, such methods may include but are not limited to thermal, radiation, or chemical catalyst curing. Protective means 38 may be, for example, commercially available encapsulant material Dexter Hysol product EO 1061. Protective means 38 can also be a physical cap attached to circuit board 16, overlaying die 14, a portion of plano surface 20, and a portion of board 16. A top perspective view of optoelectronic device package 10 is shown in FIG. 5.

Figure 6:
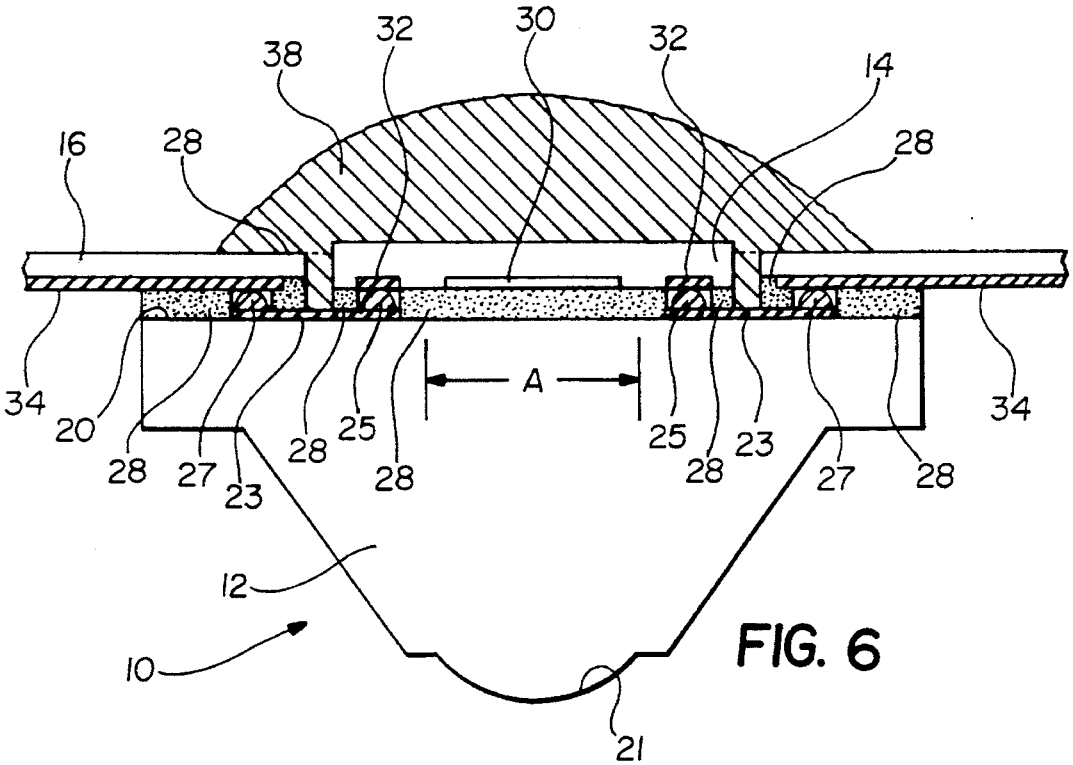
FIG. 6 is a cross-sectional view of an optoelectronic device package in accordance with an alternate embodiment of the invention.

In an alternate embodiment shown in FIG. 6, optoelectronic device package 10 is similar to that shown in FIG. 4 with the following differences. Plano surface 20 comprises a flat surface having no bumps therein. Electrical conductors 23 are formed on the plano surface 20. Each electrical conductor 23 has first and second conductive bumps, 25 and 27, respectively, formed thereon. Conductive bumps 25 and 27 are formed by a process known in the art as conductive bumping, wherein a bump of conductive material is formed upon a conductor or a conductive contact point. Die bond pads 32 electrically connect to electrical conductors 23 via first conductive bumps 25. Likewise, electrical conductors 34 of circuit board 16 electrically connect to electrical conductors 23 via second conductive bumps 27.

Figure 7:
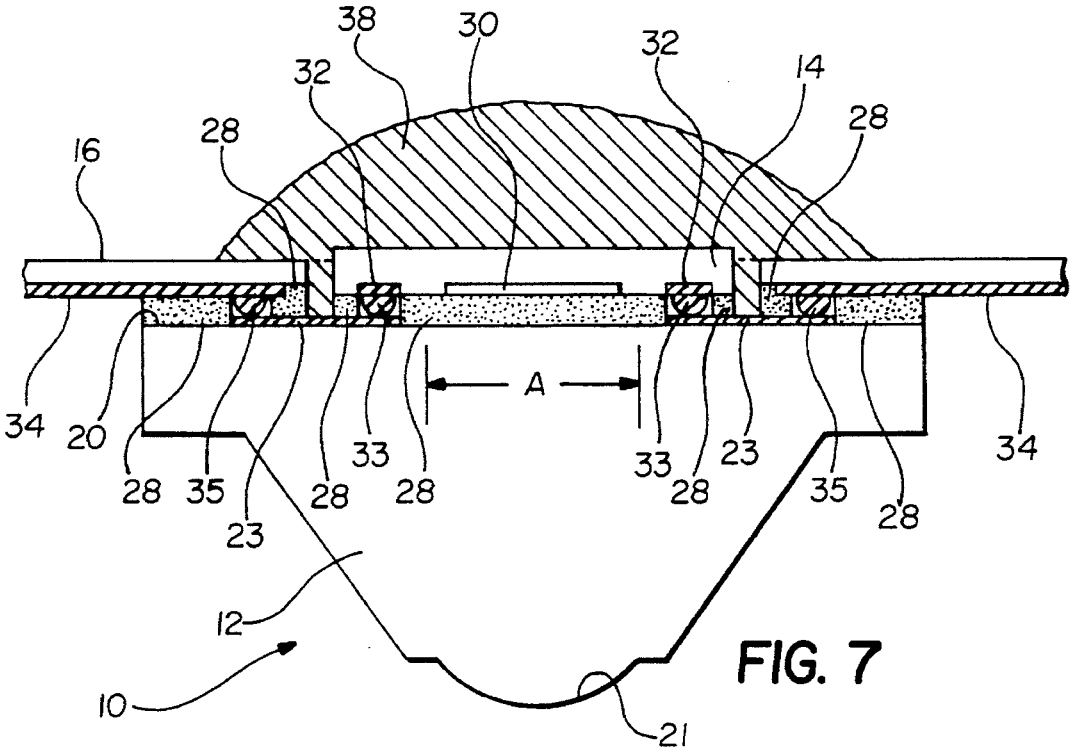
FIG. 7 is a cross-sectional view of an optoelectronic device package in accordance with an alternate embodiment of the invention.

In yet another embodiment, shown in FIG. 7, optoelectronic device package 10 is similar to that shown in FIG. 4 with the following differences. Plano surface 20 comprises a flat surface having no bumps therein. Electrical conductors 23 are formed on the plano surface 20. Die bond pads 32 have conductive bumps 33 formed thereon. Electrical conductors 34 of circuit board 16 have conductive bumps 35 formed thereon. Die bond pads 32 electrically connect to electrical conductors 23 via conductive bumps 33. Likewise, electrical conductors 34 of circuit board 16 electrically connect to electrical conductors 23 via conductive bumps 35;

In accordance with the invention, optoelectronic device package 10 is manufactured preferably by an adhesive bonding technique. While the invention is described with respect to adhesive bonding techniques, the optoelectronic device component package may be manufactured using flip chip techniques or Tape Automated Bonding. Both flip chip techniques and Tape Automated Bonding are well known in the art and are therefore not discussed herein.

Electrical conductors 22 are formed onto plano surface 20 of optical element 12, plano surface 20 having bumps 24 and 26 therein (FIG. 1). In the preferred embodiment, each conductor 22 overlays first and second bumps, 24 and 26, respectively. Optically transparent adhesive 28 is selectively screened onto plano surface 20 of element 12, leaving points of electrical connection uncovered. Die 14 is selectively placed onto plano surface 20 by standard pick and place methods for a die placement operation that is well known in the art. That is, die 14 is optically aligned to the optical element 12 using fiducial mark 23 (FIG. 2) and then placed onto plano surface 20. Circuit board 16 is similarly aligned and placed onto plano surface 20, wherein a corner edge of aperture 36 is optically aligned with fiducial mark 23. The adhesive 28 is then cured by suitable radiation as recommended by the adhesive manufacturer. For instance, the optical element 12, die 14, circuit board 16, and adhesive 28 are subjected to ultraviolet radiation and/or elevated temperture to cure adhesive 28. Curing of adhesive 28 causes optical element 12, die 14, and circuit board 16 to be drawn closer together, thus forcing electrical contact between corresponding electrical contact points.

In the alternate embodiment of FIG. 4, subsequent to curing adhesive 28, a controlled amount of curable material 38 is dispensed in a viscous state over the die 14, a portion of the plano surface 20, and a portion of circuit board 16. The curable material becomes a protective opaque encapsulant when cured. After dispensing material 38, element 12, die 14, circuit board 16, adhesive 28, and material 38 are subjected to elevated temperature to cure material 38.

The alternate embodiment, as shown in FIG. 6, is manufactured by the same method as the preferred embodiment shown in FIG. 1, except for the following. In FIG. 6, plano surface 20 of element 12 contains no bumps therein. Onto each conductor 23, formed on plano surface 20, are formed conductive bumps 25 and 27 via conductive bumping. Conductive bumps 25 and 27 electrically connect with die bond pads 32 and electrical conductors 34, respectively.

Similarly, the optoelectronic device package shown in FIG. 7 is manufactured by the same method as the preferred embodiment shown in FIG. 1, except for the following. Electrical conductors 23 are formed onto plano surface 20 of optical element 12. Die bond pads 32 of die 14 include conductive bumps 33 for electrically connecting to conductors 23 of element 12, conductive bumps 33 being formed onto die bond pads 32 by conductive bumping. Electrical conductors 34 of circuit board 16 include conductive bumps 37 for electrically connecting to conductors 23 of element 12, conductive bumps 37 being formed onto conductors 34 by conductive bumping also.

There is thus provided an optoelectronic device component, package, and methods of making the same, which provide substantial advantages over the prior art, that is, a low cost, reliable, and efficient optoelectronic device component and package.

While the invention has been particularly shown and described with respect to the certain preferred embodiments thereof, it will be understood by those skilled in the art that the foregoing and other changes in form and details may be made therein without departing from the spirit and scope of the invention.

What is claimed is:

1. An optoelectronic device package comprising:

an optical element having a plano surface, the plano surface having a pattern of electrical conductors thereon;

a photoelectric die having an optically active portion and die bond pads on a front side thereof, the front side being attached to the plano surface of said optical element and the die bond pads being electrically connected to corresponding electrical conductors of said optical element; and a printed circuit board having a pattern of electrical conductors thereon and further having an aperture for receiving said die, said circuit board being attached to the plano surface of said optical element and the electrical conductors of said circuit board being electrically connected to corresponding conductors of said optical element.

2. An optoelectronic device package as recited in claim 1, further comprising:

means for protecting a back side of said die, the plano surface of said optical element, and a portion of said circuit board.

3. An optoelectronic device package as recited in claim 1, wherein said optical element comprises a lens having a refracting surface on a front side and the plano surface on a back side.

4. An optoelectronic device package as recited in claim 3, wherein the refracting surface comprises an aspherical surface.

5. An optoelectronic device package as recited in claim 3, further comprising:

means for protecting the back side of said die, the plano surface of said lens, and a portion of said circuit board.

6. An optoelectronic device package as recited in claim 3, wherein the plano surface of said lens includes raised bumps, corresponding to first bumps and second bumps, selectively formed therein, and further wherein the electrical conductors of said lens each have a portion overlaying a first bump and a second bump, respectively, at locations for electrical contact, such that the die bond pads are electrically connected to the electrical conductors of said lens at corresponding first bumps and the circuit board conductors are electrically connected to the electrical conductors of said lens at corresponding second bumps.

7. An optoelectronic device package as recited in claim 6, further comprising:

means for protecting the back side of said die, the plano surface of said lens, and a portion of said circuit board.

8. An optoelectronic device package as recited in claim 3, wherein the electrical conductors of said lens each include a first conductive bump and a second conductive bump, the die bond pads being electrically connected to corresponding electrical conductors of said lens via corresponding first conductive bumps, and the circuit board electrical conductors being electrically connected to corresponding electrical conductors of said lens via corresponding second conductive bumps.

9. An optoelectronic device package as recited in claim 8, further comprising:

means for protecting the back side of said die, the plano surface of said lens, and a portion of said circuit board.

10. An optoelectronic device package as recited in claim 3, wherein the die bond pads of said photoelectric die include conductive bumps, the die bond pads being electrically connected to corresponding electrical conductors of said lens via the bond pad conductive bumps, and further wherein the circuit board electrical conductors include conductive bumps, the circuit board electrical conductors being electrically connected to corresponding electrical conductors of said lens via the circuit board conductor conductive bumps.

11. An optoelectronic device package as recited in claim 10, further comprising:

means for protecting the back side of said die, the plano surface of said lens, and a portion of said circuit board.

12. An optoelectronic device component comprising:

an optical element having a plano surface, the plano surface having raised bumps, corresponding to first bumps and second bumps, selectively formed therein, the plano surface further having a pattern of electrical conductors formed thereon, each conductor having a portion thereof overlaying a first bump and a second bump; and a photoelectric die having an optically active portion and die bond pads on a front side thereof, the front side being attached to the plano surface of said optical element and the die bond pads being electrically connected to corresponding electrical conductors of said optical element at corresponding first bumps.

13. An optoelectronic device package as recited in claim 12, wherein said optical element comprises a lens having a refracting surface on a front side and the plano surface on a back side.

14. An optoelectronic device package as recited in claim 13, wherein the refracting surface comprises an aspherical surface.

15. An optoelectronic device component comprising:

an optical element having a plano surface, the plano surface having a pattern of electrical conductors formed thereon, each conductor having a first conductive bump and a second conductive bump formed thereon; and a photoelectric die having an optically active portion and die bond pads on a front side thereof, the front side being attached to the plano surface of said optical element and the die bond pads being electrically connected to corresponding electrical conductors of said optical element at corresponding first conductive bumps.

16. An optoelectronic device package as recited in claim 15, wherein said optical element comprises a lens having a refracting surface on a front side and the plano surface on a back side.

17. An optoelectronic device package as recited in claim 16, wherein the refracting surface comprises an aspherical surface.

*18. An optoelectronic device component comprising:*

*an optical element having a plano surface, said optical element including a lens having a refracting surface on a front side and the plano surface on a back side, the plano surface having a pattern of electrical conductors formed thereon and,*

*a photoelectric die having an optionally active portion and die bond pads on a front side thereof, the front side being attached to the plano surface of said optical element and the die bond pads being electrically connected to corresponding electrical conductors of said optical element by conductive bumps.*

* * * * *

UNITED STATES PATENT AND TRADEMARK OFFICE

CERTIFICATE OF CORRECTION

PATENT NO. : Re.35,069
DATED : October 24, 1995
INVENTOR(S) : Hallenbeck et al.

It is certified that error appears in the above-indentified patent and that said Letters Patent is hereby corrected as shown below:

Column 8, line 34, delete "optionally" and insert --optically--.

Signed and Sealed this

Twenty-first Day of May, 1996

*Attest:*

*Attesting Officer*

BRUCE LEHMAN

*Commissioner of Patents and Trademarks*